(12) United States Patent
Léonard et al.

(10) Patent No.: US 10,802,056 B2
(45) Date of Patent: Oct. 13, 2020

(54) UPDATING A TOPOLOGY OF A DISTRIBUTION NETWORK BY SUCCESSIVE REALLOCATION OF THE METERS

(71) Applicant: HYDRO-QUÉBEC, Quebec (CA)

(72) Inventors: François Léonard, Quebec (CA); Arnaud Zinflou, Quebec (CA)

(73) Assignee: HYDRO-QUÉBEC, Quebec (CA)

( * ) Notice: Subject to any disclaimer, the term of this patent is extended or adjusted under 35 U.S.C. 154(b) by 303 days.

(21) Appl. No.: 15/778,287

(22) PCT Filed: Dec. 14, 2016

(86) PCT No.: PCT/CA2016/051470
§ 371 (c)(1),
(2) Date: May 23, 2018

(87) PCT Pub. No.: WO2017/100916
PCT Pub. Date: Jun. 22, 2017

(65) Prior Publication Data
US 2018/0356449 A1    Dec. 13, 2018

(30) Foreign Application Priority Data

Dec. 17, 2015  (CA) .................................... 2915674

(51) Int. Cl.
*G01R 19/00* (2006.01)
*H02J 13/00* (2006.01)
(Continued)

(52) U.S. Cl.
CPC ....... *G01R 19/003* (2013.01); *G01R 19/2513* (2013.01); *G01R 21/133* (2013.01); *G01R 22/063* (2013.01); *H02J 3/00* (2013.01); *H02J 13/0013* (2013.01); *H02J 2203/20* (2020.01); *Y02E 60/00* (2013.01); *Y04S 40/12* (2013.01); *Y04S 40/20* (2013.01)

(58) Field of Classification Search
CPC .............. G01R 19/003; G01R 19/2513; G01R 21/133; G01R 22/063; H02J 3/00; H02J 13/0013
See application file for complete search history.

(56) References Cited

U.S. PATENT DOCUMENTS 10,571,493 B2 *  2/2020  Sonderegger ........ G01R 19/003
2012/0229089 A1   9/2012  Bemmel et al.
(Continued)

*Primary Examiner* — Bryan Bui
(74) *Attorney, Agent, or Firm* — Muirhead and Saturnelli, LLC

(57) ABSTRACT

There is proposed a computer-implemented method for automatic correction of a topology of a smart network that uses the information contained in the voltage measurements provided by smart meters in order to determine which meter is connected to which transformer. The method starts from an initial topology and divides up the meters into first and second batches for each transformer. Successive reallocations of meters in the second batches are made according to similarities with average voltages calculated and corrected from the first batches of meters. The method proceeds by iterations until there remain no more meters attributable to other transformers and updates the topology so that its evolution at a given time be readable.

17 Claims, 9 Drawing Sheets

(51) Int. Cl.
*H02J 3/00* (2006.01)
*G01R 22/06* (2006.01)
*G01R 19/25* (2006.01)
*G01R 21/133* (2006.01)

(56) References Cited

U.S. PATENT DOCUMENTS

| | | |
|---|---|---|
| 2013/0278437 A1 | 10/2013 | Van Wyk |
| 2014/0012524 A1 | 1/2014 | Flammer |
| 2015/0241482 A1 | 8/2015 | Sonderegger |
| 2015/0241488 A1 | 8/2015 | Sonderegger |
| 2016/0109491 A1 | 4/2016 | Kann |
| 2016/0109497 A1 | 4/2016 | Aiello et al. |
| 2016/0131501 A1 | 5/2016 | Steigler |

* cited by examiner

UPDATING A TOPOLOGY OF A DISTRIBUTION NETWORK BY SUCCESSIVE REALLOCATION OF THE METERS

FIELD OF THE INVENTION

The invention relates to a computer implemented method for automatic correction and updating of a topology of an electrical distribution network by successive reallocation of the meters.

BACKGROUND

When putting a distribution network into service and during installation of electric meters, meter to transformer allocation errors sometimes happen in the records of the network description database as well as geolocation entry errors. The network evolves when the operator displaces the connection of some meters to balance the loads between the available neighboring transformers without making an entry or making the proper entry in the database. The result is a database containing a description deviating from reality and whose number of disparities increases through time. The consequences are multiple: load balancing errors between the transformers, transformer replacement or addition planning errors, error or loss of sensitivity for detection of electrical non-compliances. There is thus a need for an operator to have a method that would allow continually updating the database describing the network.

In a modern distribution network, in addition to smart meters one can find a small proportion of non-communicating meters (most of the time of electromechanical types) that are unable to transmit their voltage/consumption readings and meter-less flat rate connections (e.g. urban lighting). To these legitimate consumers of power are added the electricity thefts. The lack of knowledge of these power flows makes it difficult to balance the calculations of power flow (or losses) in the network tree, from the consumer up to the line beginning in a feeder. Any method using the power fluctuations to determine the topology works as long as the power flowing through a meter exhibits a time-domain pattern which is distinct from the patterns of the unknown power flows.

Statistically, in decreasing order of influence, the voltage measured by a meter varies as a function of the voltage at the line beginning (e.g. tap changer switching), of the load carried by this meter, of the load carried by the other meters connected to the same transformer and as a function of the load carried by the other transformers connected to the same line. Any method using the voltage fluctuations to determine the topology of a low-voltage line works as long as the load carried by a neighboring transformer will have less impact on the measured voltage of a meter than the load carried by the transformer to which it is connected.

The use of the information transmitted during a blackout on a portion of the network allows allocating the meters affected by the blackout to this portion. This method has two important drawbacks. The first one is that in order to allocate a meter to a transformer, it is necessary to wait for a blackout affecting only the network of this transformer. The second one is that in this latter case, there is a possibility that it is the transformer that is overloaded and that there will be displacement of one or many meters such that the topology inferred from the blackout is said to be "time minus one" (t−1) because it corresponds to the preceding topology.

US 2015/0241482 (Sonderegger) entitled "Smart grid topology estimator" describes a method that correlates the voltage variations between two meters and determines whether they are both connected to a same transformer. This method starts the allocating process without prior knowledge of the network. One of the main limitations is that the similarity is applied between the voltage fluctuations of two meters at a time and that the proposed similarity function is the correlation only. This method does not time-locate the displacement of a meter connection. This method requires significant computing power if the geolocation coordinates are not available in order to limit the number of meters to be correlated to a given neighborhood. This method also urges the time synchronization of the time-series of voltage measurements by correlation in order to correct the time-stamp errors on the data collected by the meters. It may be noted that this time synchronization is not required with modern equipments properly configured and it may even cause a problem by unduly increasing the correlation between two compared time-series by desynchronizing them despite the veracity of the time stamps.

U.S. Pat. No. 9,285,242 (Arya et al.) entitled "Determining a connectivity model in smart grids" describes a method that tracks the power flow in the tree of the network. A drawback of this method is that it requires power related measurements at different nodes of the tree, thus at the transformers and at the lines. Another drawback of this method is that the electricity thefts and the non-communicating meters not connected to the communication network disturb the power related measurements and compromise the power flow monitoring. A serious drawback is that this method cannot process the case of a meter having a power consumption below the sum of the measurement errors of the other meters that consume a lot of power and the fluctuations of the network losses. Also, the method does not take into account the fluctuations of the losses in the equipments that are function of the load and the ambient temperature.

U.S. Pat. No. 9,214,836 (Flammer, III) entitled "Power grid topology discovery via time correlation of passive measurement events" describes a method that detects and classifies the voltage fluctuation events and correlates them in order to determine if two meters are connected to a same transformer. From a signal processing point of view, the proposed method uses only a small part of the signal, namely only the important punctual voltage fluctuations qualified as "events" in the description of the method. The classification of the events proposed by the method reduces the information supported by several time-stamped voltage measurement records to a set of characteristics corresponding to the allocated class: this reduction does not create information, it deletes it and so may introduce an imprecision in the subsequent analysis. The method does not group the information common to several meters allocated to a same transformer so as to compare it to a meter to determine if it is also connected to the same transformer: such an information grouping (for example by averaging) would have decreased the inherent dispersion of the information individually taken from each meter.

US 2016/0131501 (Steigler) entitled "Correlating meter data to detect mismapping" describes a method using voltage and geographic position data of a meter in order to correct the topology of a low-voltage network. This method only processes the cases of location errors of meters geographically close to each others. However, during a meter entry in the database, a transformer name entry error leads to a transformer that may be located anywhere on the network, including on another line. This method is sensitive to existing errors in the geomatic database (meter location, transformer location and address of the consumption site). The method proposes a mismapping metric that is a function of the individual correlations of the meters allocated to a transformer with the selected meter. In the often observed case where, for a given transformer there is more than one connection error of meters, a part of the comparison calculated for the selected meter will be made with correlations individually performed on one or many meters that are not connected to the transformer.

SUMMARY

According to an aspect of the invention, there is provided a computer-implemented method for automatic correction of a topology of an electrical distribution network defined by respective allocations of meters to transformers, the method comprising the steps of:
  (i) for each transformer of the topology, dividing up the meters allocated to the transformer into first and second batches according to a dividing criteria and a degree of similarity of the records of voltages measured by the meters with respect to an average voltage estimated with the records of voltages measured by the meters allocated to the transformer so that the first batch comprises the meters whose degree of similarity is higher than the meters of the second batch;
  (ii) initially for each transformer of the topology then subsequently for each transformer whose allocation of meters has changed, calculating a corrected average voltage with the records of voltages measured by the meters only in the first batch of the transformer;
  (iii) calculating a similarity of the records of voltages measured by the meters in the second batches of the transformers with the corrected average voltages of the transformers calculated in (ii);
  (iv) for each transformer of the topology, determining which are, in the second batch, the meters attributable to another transformer according to the similarities calculated in (iii);
  (v) reallocating at least one of the meters determined in (iv); and
  (vi) as long as a meter has been reallocated in (v), repeating steps (ii) to (v),
the topology being corrected when there remain no more meters attributable to other transformers in the second batches.

According to another aspect of the invention, there is provided a method for evaluating a connection resistance of a meter to a distribution transformer to which other meters are connected, comprising the steps of:
  obtaining records of voltages and of consumptions of each meter connected to the distribution transformer; and
  evaluating the connection resistance $R_i$ of the meter with a ratio of sums of discrete derivatives according to the following equation:

$$R_i = -\frac{\sum_{n=2}^{N}(\partial v_{i,n} - \partial v_{k,n}) \cdot \partial c_{i,n}}{\sum_{n=2}^{N}(\partial c_{i,n})^2}$$

where i represents an index of the meter among all the meters, n represents a time interval among a time length covering N records of voltages v and of consumptions c of the meter i, k representing an index of the distribution transformer among other distribution transformers, the voltage $v_{k,n}$ being an average voltage estimated with the records of voltages of all the meters for the time interval n.

According to another aspect of the invention, there is also provided a computer system for automatic correction of a topology of an electrical distribution network defined by respective allocations of meters to transformers, the computer system comprising at least one storage device for a database of topological data representing the topology of the electrical distribution network, at least one storage device for records of voltages measured by the meters, and a processing unit having an interface for communicating with the storage devices, at least one processor and a memory storing instructions executable by the processor and configuring the processing unit to perform the steps of:
  (i) for each transformer of the topology, dividing up the meters allocated to the transformer into first and second batches according to a dividing criteria and a degree of similarity of the records of voltages measured by the meters with respect to an average voltage estimated with the records of voltages measured by the meters allocated to the transformer so that the first batch comprises the meters whose degree of similarity is higher than the meters of the second batch;
  (ii) initially for each transformer of the topology then subsequently for each transformer whose allocation of meters has changed, calculating a corrected average voltage with the records of voltages measured by the meters only in the first batch of the transformer;
  (iii) calculating a similarity of the records of voltages measured by the meters in the second batches of the transformers with the corrected average voltages of the transformers calculated in (ii);
  (iv) for each transformer of the topology, determining which are, in the second batch, the meters attributable to another transformer according to the similarities calculated in (iii);
  (v) reallocating at least one of the meters determined in (iv); and
  (vi) as long as a meter has been reallocated in (v), repeating steps (ii) to (v),
the topology being corrected when there remain no more meters attributable to other transformers in the second batches.

The following provides an outline of certain possibly preferable features of the invention which are to be considered non-restrictively and which will be more fully described hereinafter.

The method according to the invention uses the information contained in the voltage measurements collected by smart meters in order to determine which meter is connected to which transformer. According to an embodiment of the invention, the method starts from an initial topology which potentially comprises meter-to-transformer allocation errors and performs successive reallocations until each meter is allocated to the network of a transformer for which the voltage of the meter has the most similarity with the average voltage of this network. Preferably, one implementation of similarity calculation is a function of the distance between two time-series of voltage projected in a multidimensional space, or of the correlation between these series, or a combination of the distance and of the correlation, and a possible contribution of time-series of consumption. The time-series of consumption may be used to correct the distance and also as input of a switching function of the data between the calculation of the distance and the calculation of the correlation. The similarity calculation may use an estimation of the apparent connection resistance of the meter under validation. This estimation may indicates the presence of an electrical non-compliance (ENC) when the value of the connection resistance is outside a range of plausible values, i.e. either too low or too high with respect to those observed for the other meters. To sum up, the method according to the invention may comprise the successive steps of dividing up the meters allocated to a transformer into two batches according to a degree of similarity of each meter with the other meters so that a batch comprises the meters qualified as unchangeable because they are similar to the whole batch while the second batch comprises the meters qualified as changeable (or mobile) because they are less similar, of calculating a corrected average voltage per transformer from the batch of unchangeable meters, of calculating the similarity of the mobile meters of all the transformers with the corrected average voltage of each transformer, of finding for each transformer which ones of the mobile meters can be reallocated, of selecting for each transformer where there is at least one meter to be reallocated which one will be prioritized if desired, of reallocating at least one meter and, if there remain mobile meters that can be reallocated, of returning to the step of dividing up into batches of unchangeable and mobile meters, of performing this step for the transformers that had a reallocation of meters and of performing a new iteration by following the next steps, otherwise, the reallocations are finished.

An advantage of the method according to the invention is that in contrast to the prior art methods where I meters must be compared with I–1 meters, for a total of I(I–1) operations, the method according to the invention compares I meters with K transformers, so that the computing power is reduced and the accuracy is improved since the average voltage of each transformer calculated from the meters the most similar between them is a more reliable value since the "mobile" meters potentially connected to another transformer do not contribute to this calculation. The result of the update provides the history of the displacements of meters and from this history can be extracted a topology corresponding to a given time.

Another advantage of the method according to the invention is that it does not require geolocation data or measurement devices on the transformers or on the medium-voltage line beginning in a transformation station.

DETAILED DESCRIPTION OF THE PREFERRED EMBODIMENTS

The method according to the invention allows updating a database describing the meter-transformer pairing of a low-voltage network. The data used for setting an update are:
  a database containing the meter-transformer allocation links and possibly comprising a certain proportion of allocation errors,
  measurements of voltages and preferably of consumption of the meters indexed as a function of an identity of the meter and possibly date and time marked with a time-stamp.

The topology of the electrical distribution network comprises at the minimum the meter-transformer allocation links. These links may be available under different indexing forms, with or without date and time marking of the displacements of meters and of the additions of new meters and transformers.

The voltage measurements may be of different natures, for example: instantaneous RMS, average RMS voltage between two timestamps, average RMS voltage for a given time length. The consumption measurements will typically be expressed in kilowatt-hour (kWh) cumulated between two timestamps. It is desirable that these measurements be date and time marked, or, at least, available in time order of reading.

The energy consumption measurement of a meter is mostly independent from the other events occurring on the network. This consumption measurement, summed for the smart meters presumed to be connected to a transformer, represents a portion of the load of this transformer, the other portion being the non-communicating meters, the flat rate connections (e.g. meter-less city lighting) and the electricity theft.

In an embodiment of the method according to the invention, the reactive portion of the impedance is neglected by considering the power factor as unitary, since the corresponding measurements are often not forwarded to the database. However, in a possible embodiment of the method according to the invention, the reactive portion may be considered to improve the likelihood of the proposed corrections by introducing it as an input variable in the following expressions.

Figure 1:
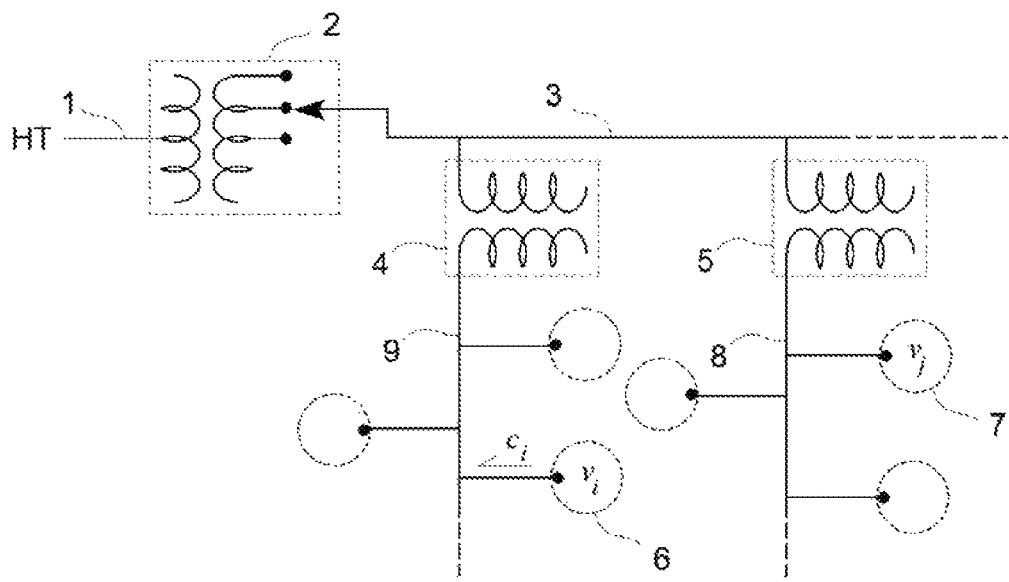
FIG. 1 shows an example of a single-wire diagram of a tree portion starting from a high-voltage phase (HT) and supplying a medium-voltage line connected to two medium-to-low-voltage transformers to which several consumer meters are connected.

Referring to FIG. 1, the voltage fluctuations attributable to the high-voltage network 1 and to the tap changes of the transformer 2 supplying the medium-voltage line 3 are a source of noise common to all the transformers 4, 5 connected to the same line 3 as well as the meters 6, 7 connected thereto. Not only this fluctuation is common but it has an amplitude similar for all the meters since the relative decrease, with respect to the network voltage, of its amplitude follows the relative voltage drop of the network as the meters are farther with respect to the transformer 2. It will be seen hereinafter how the method according to the invention is insensitive to the voltage fluctuations common to all the meters.

Figure 2:
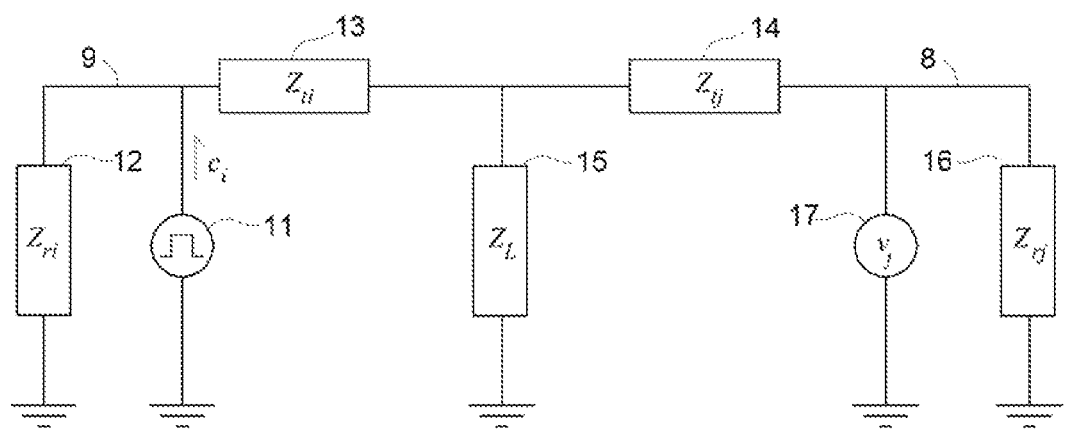
FIG. 2 shows a network of impedances equivalent to a single-phase tree portion connecting two meters connected to different medium-to-low-voltage transformers and where one of the meters carries a load variation reflecting as a modulation of current $c_i$ that is viewed as a variation of voltage $v_i$ by another meter.

Moreover, a load switching of a consumer causes a current fluctuation that, due to the impedance of the network, will be perceived as a voltage fluctuation by any meter closely or remotely connected on this network. This voltage fluctuation generated by the switching of a load on the network is attenuated between the switching location and the location of the meter 7 that measures the corresponding voltage fluctuation. These voltage fluctuations may be used to determine a degree of similarity between two meters. For example, if a meter is located in a same building at a few centimeters of a meter that supplies the switched load, both of these meters will sense almost the same voltage fluctuation. Referring also to FIG. 2, in contrast, if a meter 7 that is located on the network 8 of the neighboring transformer 5 of the meter 6 carrying the load switching measures the voltage 17, the fluctuation of current 11 will be attenuated by a divider made of the network formed by the impedances of the transformers 13, 14, the impedances of the networks 12, 16 supplied by the transformers and of the line 15. The network then acts as an attenuation filter that typically decreases the amplitude of a fluctuation passing from one low-voltage network 9 to the other 8 by one order of magnitude to two orders of magnitude.

Regarding meters connected to a same transformer, two extreme cases of meter location may be discussed, namely the meter whose connection is the closest to the transformer and that whose connection is the farthest from the transformer. For a same switched load, the meter whose connection is the farthest will impact more the voltage of all the meters located between it and the transformer, whereas the meter whose connection is the closest will impact the whole set of meters at a same minimum magnitude. At this stage, for meters connected to a same transformer, the variation of voltage perceived by the meters is function of the position of the meter operating the load switching and of the position of the meter recording the variation of voltage.

The case of a network where single-phase clients are connected to clients having a three-phase supply is more complex than the single-phase circuit described above and illustrated in FIGS. 1 and 2. Indeed, on one hand, the phase-to-phase impedances of the three-phase equipments allow a transfer of the voltage fluctuations from one phase to the other and, on the other hand, these equipments will generate common load variations to the three phases, increasing the difficulty of allocation of a single-phase meter to a given phase. However, the previous reasoning as well as the following developments remain applicable.

Whether in the search of a maximum of similarity or the search of a minimum of dissimilarity, the finality is the same. In the following, the terms similar and similitude may respectively correspond to the terms dissimilar and dissimilitude, with inversion of the terms of optimisation such as the maximization or the minimization.

The discrete series of instantaneous average voltage of the line corresponding to the instantaneous average of the voltages of all the meters i connected to a line L may be expressed as $$v_{L,n} = \frac{1}{\sum_{i \in L} 1} \cdot \sum_{i \in L} v_{i,n} \qquad (1)$$

where L is the set of indexes of the meters connected to the line L, and for which measurements of voltages $v_{i,n}$ are available and this for the timestamp of index n.

Figure 3:
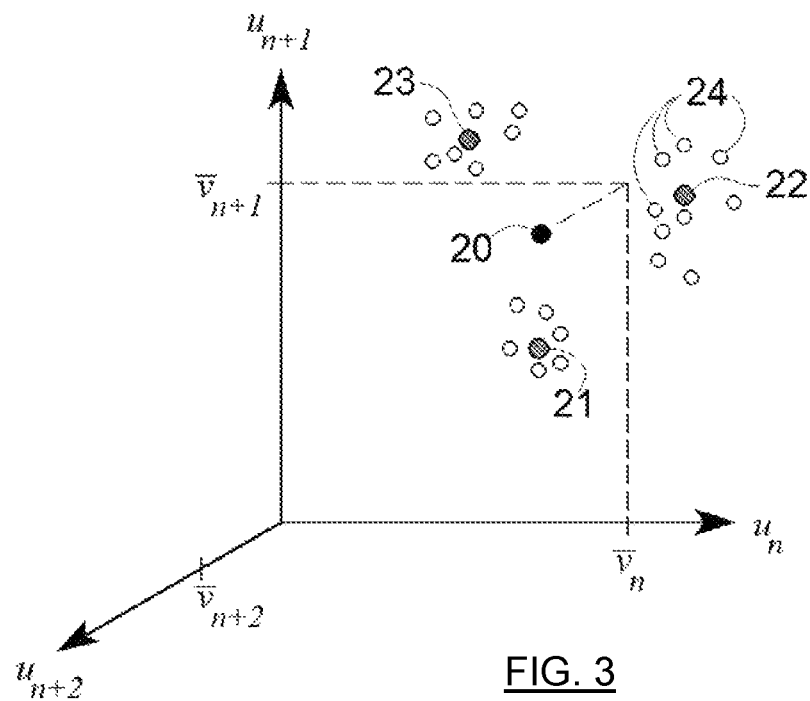
FIG. 3 shows a multidimensional representation of voltages-series of meters connected to a line, with the voltages-series for each transformer and for the line.

Referring to FIG. 3, this average voltage for N timestamps is represented in a multidimensional space $R^N$ where the $u_n$ are de voltage axes. This average voltage then appears as a point 20 in this space.

The discrete time-series of the instantaneous average voltage of one of the transformers connected to the medium-voltage line may be expressed as $$v_{k,n} = \frac{1}{\sum_{i \in T_k} 1} \cdot \sum_{i \in T_k} v_{i,n} \qquad (2)$$

where $T_k$ is the set of indexes of the meters connected to the transformer k. In a multidimensional representation, the discrete time-series of the instantaneous average voltage associated to the different transformers will appear as points 21, 22, 23. Each one of these points will be located at the centroid of a cloud made of the voltages of the meters 24 connected to the corresponding transformer 22.

A correlation defined as the product of centered correlation (Pearson) may be expressed as $$\gamma_{i,j} = \frac{\sum_{n=1}^{N} (v_{i,n} - \bar{v}_i) \cdot (v_{j,n} - \bar{v}_j)}{\sqrt{\sum_{n=1}^{N} (v_{i,n} - \bar{v}_i)^2 \cdot \sum_{n=1}^{N} (v_{j,n} - \bar{v}_j)^2}} \qquad (3)$$

with the discrete time averages of voltages $$\overline{v}_i = \frac{1}{N}\sum_{n=1}^{N} v_{i,n} \ et \ \overline{v}_j = \frac{1}{N}\sum_{n=1}^{N} v_{j,n} \quad (4)$$

where $v_{i,n}$ and $v_{j,n}$ are two series of records of voltages compared with n as time index. The distance between two compared series of records of voltages with n as time index may be expressed as $$d_{i,j} = \sqrt{\sum_{n=1}^{N}(v_{i,n} - v_{j,n})^2} \quad (5)$$

For the relations 3 and 5, the comparison may be performed between two meters, between one meter and the instantaneous average voltage calculated for a transformer or even between the instantaneous average voltage of the line and that of a transformer.

A set of records may for example comprise from some hours to some months of records. The corresponding time length may be shorter if the records are at close time interval, for example every 5 or 15 minutes instead of every hours.

In multidimensional representation of the discrete time-series of the measured voltage (or measurements of voltages), the points corresponding to the farthest meters from the transformer will be closer to the origin (0,0,...) whereas those corresponding to the closest meters having a higher voltage on average will be located farther from the origin with respect to the point corresponding to the average voltage of all the meters.

A preferred embodiment of the method according to the invention uses the discrete derivatives of voltage instead of the voltage so that the method is less sensible to voltage changes of long period common to all the meters and also less sensible to systematic errors attributable to the calibration differences in the meters. As it is possible to use the method with the voltages as with the voltage derivatives, for the disclosure hereinafter, the term "discrete time-series of voltage measurements" may also correspond to "discrete time-series of the derivative of the voltage measurements", unless specified otherwise. However, where derivatives of voltage will appear (in the mathematical expressions, in the text and the figures), they should not be substituted by the voltages. Also, in order to simplify the text, the term voltage-series will be used to designate a discrete time-series of voltage. In the case of a meter, this will correspond to a discrete time-series of the voltage measured by the meter. In the case of a transformer, it will correspond to a discrete time-series of instantaneous average voltage calculated for the transformer while in the case of a line, it will correspond to a discrete time-series of instantaneous average voltage calculated for the line.

Figure 4:
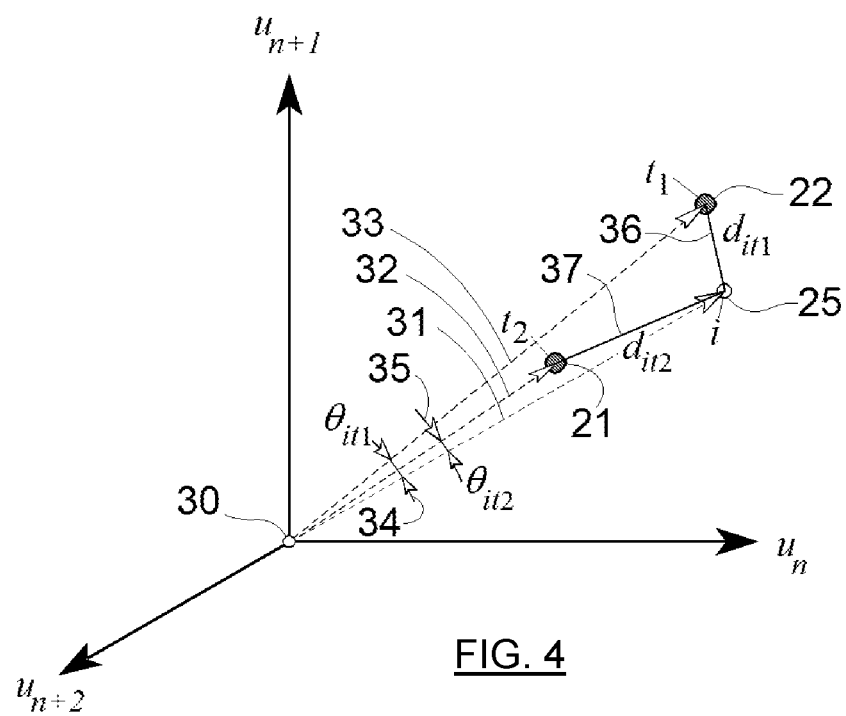
FIG. 4 shows a multidimensional representation of a comparison between the correlation and the distance for a voltages-series measured by a meter and compared to voltages-series calculated for two transformers where $t_1$ is that to which the meter is connected.

Referring to FIG. 4, there is shown a multidimensional representation of a comparison between the voltage-series of the meter i and the voltages-series calculated for the transformers t1 and t2. The correlation coefficient between the voltage-series for the meter 25 and the voltage-series of the transformer t$_1$ 22 to which it is connected corresponds to the cosine of the angle 34 between two vectors, one vector 31 connecting the origin 30 and the voltage-series measured by the meter 25 and the other vector 33 connecting the origin 30 and the voltage-series calculated for t$_1$ 22. The correlation coefficient between the voltage-series measured by the meter 25 and the voltage-series of the transformer t$_2$ 21 corresponds to the cosine of the angle 35 between two vectors, one vector 31 connecting the origin 30 and the voltage-series measured by the meter 25 and the other vector 32 connecting the origin 30 and the voltage-series calculated for t$_2$ 21. It can be noted in this example that the voltage-series of the meter correlates more with that of the transformer t$_2$ 21 than with that of the transformer t$_1$ 22 to which it is connected. However, the distance $d_{it1}$ 36 between the voltage-series of the meter 25 and that of the transformer t$_1$ 22 to which it is connected is lesser than the distance $d_{it2}$ 37 between the voltage-series of the meter 25 and that of the transformer t$_2$ 21.

To improve the correlation, the voltage-series calculated for the line may be subtracted. The voltage-series of the line $v_{L,n}$ is a significant voltage of the voltage of the power source supplying all the meters of this line. If the voltage-series $v_{L,n}$ is subtracted from the voltages-series measured by both meters in equation 2, such that $v_{i,n}-v_{L,n}$ and $v_{j,n}-v_{L,n}$ respectively replace $v_{i,n}$ and $v_{j,n}$, this gives $$\gamma'_{i,j} = \frac{\sum_{n=1}^{N}(v_{i,n} - v_{L,n} - \overline{v}_i + \overline{v}_L)\cdot(v_{j,n} - v_{L,n} - \overline{v}_j + \overline{v}_L)}{\sqrt{\sum_{n=1}^{N}(v_{i,n} - v_{L,n} - \overline{v}_i + \overline{v}_L)^2 \cdot \sum_{n=1}^{N}(v_{j,n} - v_{L,n} - \overline{v}_j + \overline{v}_L)^2}} \quad (6)$$

This may be expressed as $$\gamma'_{i,j} \cong \frac{\sum_{n=1}^{N}(v_{i,n} - \overline{v}_i)\cdot(v_{j,n} - \overline{v}_j) - \sigma_L^2}{\sqrt{\left(\sum_{n=1}^{N}(v_{i,n} - \overline{v}_i)^2 - \sigma_L^2\right)\cdot\left(\sum_{n=1}^{N}(v_{j,n} - \overline{v}_j)^2 - \sigma_L^2\right)}} \quad (7)$$

after algebraic manipulation, by supposing that the line voltage variations are not correlated with the variations induced by the loads, and with $$\sigma_L^2 = \sum_{n=1}^{N}(v_{L,n} - \overline{v}_L)^2 \quad (8)$$

as the square of the quadratic dispersion of the line voltage. From a geometric point of view in the multidimensional space $R^N$, the removal of the vector $V_L \equiv [v_{L,1}, v_{L,2}, \ldots, v_{L,N}]$ from the vectors $V_i \equiv [v_{i,1}, v_{i,2}, \ldots, v_{i,N}]$ and $V_j \equiv [v_{j,1}, v_{j,2}, \ldots, v_{j,N}]$ corresponds to a translation of the points pointed by these two vectors. This translation changes the correlation values without moving these points closer or farther. A decision based on the correlation may be modified by a translation while a decision based on the distance is independent from the translation. It may be concluded that the result of the correlation is affected by the magnitude of the series $V_L$ of line voltages that appears common in the networks, which is not the case for a distance calculation.

Referring again to FIG. 2, viewed differently through a practical example, assuming a load manipulation 11 remote from a measurement point 17, if there are no other load manipulations on the network then the measurement point 17 will observe this fluctuation with a perfect correlation between the voltage measured by the meter 11 that carries this fluctuation and the meter 17 that measures from a distance. However, if there are numerous load modulations distributed on the network, they will generate voltage fluctuations that will add up to the voltage measurement taken by the meters. These fluctuations will cause the voltage measured at a distance 17 to correlate less with the voltage measured where the load manipulation 11 occurs. There are contexts where the correlation magnitude is not a reliable characteristic for similarity indication between two meters or between one meter and the average voltage calculated for a transformer. A silence on the line at the moment of the load modulation conveyed by a meter is enough to make the latter be seen as similar for many other measurement points. As a calculation means of the similarity, maximizing the correlation is not equal to minimizing the distance and may lead to a false decision. This is one of the weakness of the methods proposed in the applications US 2015/0241482 (Sonderegger) and US 2016/0131501 (Steigler).

In the following development, it is proposed to add the optimization of the distance to the similarity function.

Figure 5:
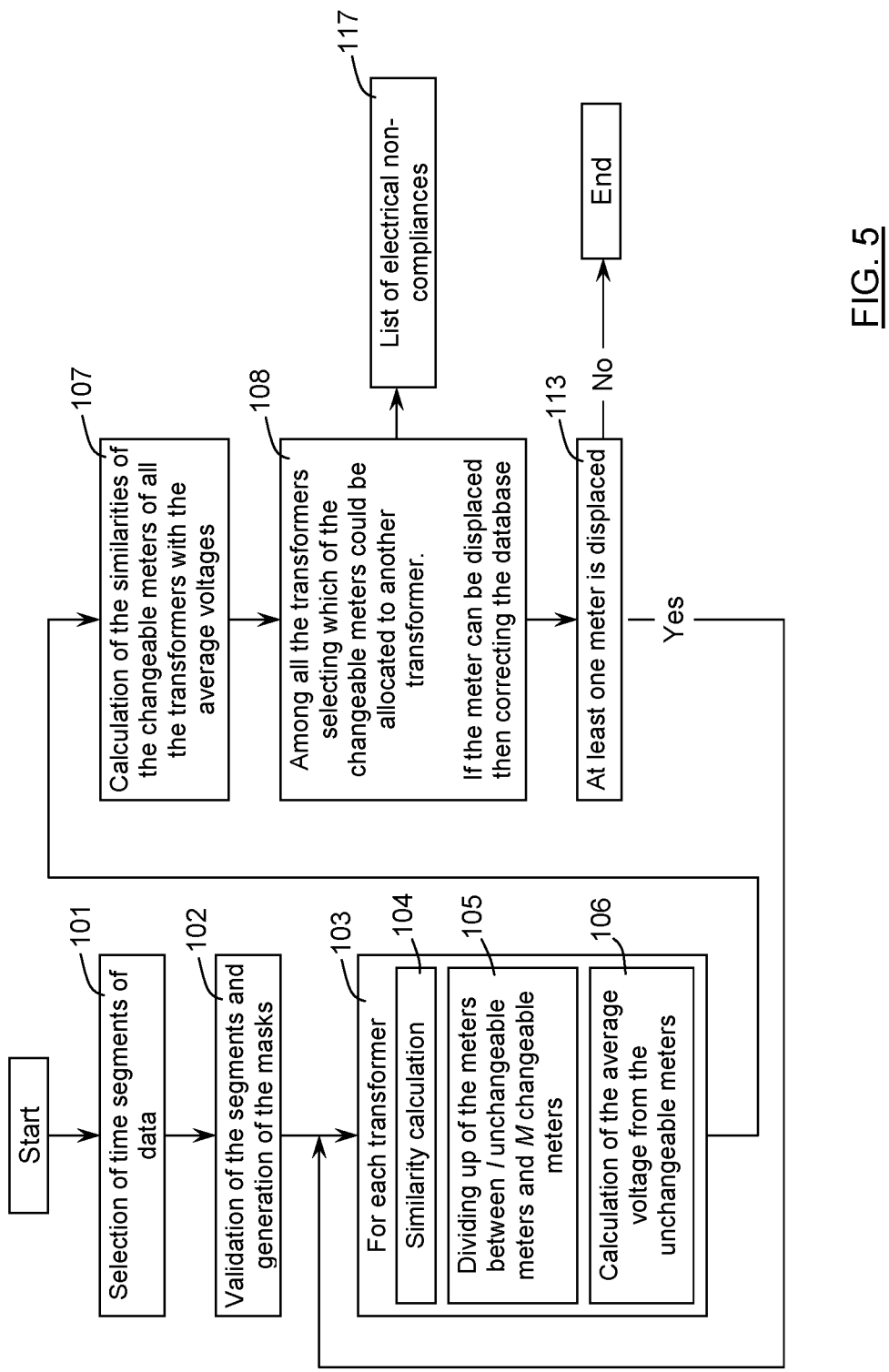
FIG. 5 is a schematic diagram showing the main steps of an embodiment of the method according to the invention, said optimal for successive reallocation of the meters to the transformers to which they are connected.

Referring to FIG. 5, an embodiment of the method according to the invention proceeds by a selection of the time segments of data 101 available in the database in a central storage device 301 or in one or several storage devices distributed or not in the network of meters 300, for example when the meters are provided with functionalities for storing the measurements or records forming the data. This selection step determines a time range considered for the similarity calculation. According to a preferred embodiment of the method, in order to detect a meter displacement, the selection comprises at least two successive time segments. A validation step of the segments 102 generates a mask that will be an attribute of each meter or group of meters. In this step, the blackouts and anomalies are detected to reject the corresponding time-stamped records. The blackouts are common to a transformer or several transformers while the anomalies may pertain to a single client. In the case of an anomaly detected for a single client, it will typically be an abnormal pattern corresponding to significant voltage drops unobserved on the other meters and possibly generated by a connection defect. Thereafter, for each calculation operation, the masks will be combined in intersection in order to process only the data simultaneously valid for all the inputs of the operation.

As illustrated by bloc 103, the similarity 104 between the meters that are connected to a same transformer is calculated for each transformer. For example, the similarity function S estimating a similarity $$s_{i,k} = S(v_i; \{v_{j_1}, v_{j_2}, \ldots, v_{j_y}, \ldots\}|_{j_y \in T_k}) \quad (9)$$

between the voltage vector $v_i$ corresponding to the meter i and the voltage vectors $v_{j_y}$ of the other meters connected to the transformer k may by used, where a voltage-series of a meter corresponds to the voltage vector $$v_z = [v_{z,1}, v_{z,2}, \ldots, v_{z,n}, \ldots v_{z,N}] \text{ with } z \in \{i, j_1, j_2, \ldots\}, \quad (10)$$

n being the time index of the records. The meters connected to the transformer k or a subset of these meters participate to the estimation expressed by equation 9.

Referring again to FIG. 3, a similarity function based on the distance may take different formulations. For example, for each meter i, the quadratic sum of the distances that its voltage-series has with that of the other meters connected to the same transformer k may be performed such as $$s_{i,k} = \sqrt{\frac{1}{\sum_{j \in T_k} 1} \cdot \sum_{j \in T_k} d_{i,j}^2} \text{ with } d_{i,j} = \sqrt{\sum_{n=1}^{N} (v_{i,n} - v_{j,n})^2} \quad (11a)$$

or, still, the sum of the distances (possibly less precise) such as $$s_{i,k} = \frac{1}{\sum_{j \in T_k} 1} \cdot \sum_{j \in T_k} d_{i,j}^2. \quad (11b)$$

or, still, according to a preferred embodiment of the method, $$s_{i,k} = \sqrt{\sum_{n=1}^{N} (v_{i,n} - v_{k,n})^2} \quad (11c)$$

where the voltage $v_{k,n}$ is the voltage-series of the transformer k as calculated with equation 2. The expression 11c tends towards zero when the multidimensional representation point corresponding to a meter tends to overlap to that of the transformer 22, while 11a and 11b tend towards a non-zero quantity that is a function of the dispersion of the meters 24 around the transformer 22.

Referring again to FIG. 5, the similarity calculated for each meter connected to a transformer is grouped in the similarity vector $$S_k = [\ldots s_{i,k} \ldots]. \quad (12)$$

This vector will be used in step 105 of dividing up the meters between $U_k$ unchangeable meters that are the most similar, and $C_k$ changeable (mobile) meters such that $$U_k = \sum_{i_k \in U_k} 1 \text{ and } C_k = \sum_{i_k \in C_k} 1 \quad (13)$$

with $U_k \cup C_k = T_k$ and $U_k + C_k = T_k$, i.e. the union of the sets of unchangeable meters and of the changeable meters corresponds to the set of meters connected to the transformer k according to the initial topological description. The number of changeable meters may be a fixed number or, according to a preferred embodiment of the method, given in a determined proportion of the number of meters connected to the transformer. According to the preferred embodiment, the process parameter $$\alpha = \frac{U_k}{T_k} \quad (14)$$

sets the ratio of the number of unchangeable meters $U_k$ over the total number of meters $T_k$. Typically but not restrictively, the ratio $\alpha$ is set to 30% with a minimum of one changeable meter from a population of three or more meters assigned to a transformer. $U_k=1$ and $C_k=0$ in the case of a transformer having only one meter connected thereto. In such a case, the meter will be considered to be unchangeable. A preferred embodiment of the method will sort the $s_{i,k}$ elements of $S_k$ by decreasing order of similarity and will classify the $U_k$ first elements as unchangeable. As illustrated by block 106, a calculation of the corrected voltage-series attributed to a transformer $$v_{k,n}^U = \frac{1}{U_k} \cdot \sum_{i \in U_k} v_{i,n} \tag{15}$$

is achieved from the voltages-series of the $U_k$ unchangeable meters. This ensures that the remote meters 28 of the cloud made of the voltages-series of meters connected to the transformer and that, possibly, may not be connected to the transformer do not participate to this corrected voltage-series calculation. For the case of a changeable meter to be validated with respect to its initial transformer, this calculation allows to not consider the voltage-series of the meter to be validated in the calculation of the voltage-series of the transformer. Without this exclusion, for a network comprising I meters, there would be an advantage for this choice of meter-transformer connection in a proportion of 1/I reflecting the relative weight of the voltage of the meter under validation with respect to the other meters.

The corrected voltage-series of each transformer is used to perform the calculation of the similarities such as, according to a preferred embodiment of the method, $$S_k^U = [\ldots \; s_{i,k}^U \; \ldots], \text{ with } s_{i,k}^U = \sqrt{\sum_{n=1}^N (v_{i,n} - v_{k,n}^U)^2} . \tag{16}$$

The use of the set of unchangeable meters may be extended to the calculation of the correlation between a changeable meter i and a transformer k such as $$\gamma_{i,k}^U = \frac{\sum_{n=1}^N (v_{i,n} - \overline{v}_i) \cdot (v_{k,n}^U - \overline{v}_k^U)}{\sqrt{\sum_{n=1}^N (v_{i,n} - \overline{v}_i)^2 \cdot \sum_{n=1}^N (v_{k,n}^U - \overline{v}_k^U)^2}} \tag{17}$$

with $$\overline{v}_k^U = \frac{1}{N} \sum_{n=1}^N v_{k,n}^U . \tag{18}$$

The voltage perturbations caused by an electricity theft or the presence of a non-communicating meter do not impair the method. On the contrary, in $R^N$ (FIG. 3), they increase the distance and decrease the correlation that the transformer on which the unmetered consumption occurs has with the other transformers.

This latter similarity function based on the distance provides excellent results when the meter carries a small load (a load that does not vary much through time in the case of the voltage derivative) compared to the other meters. In the opposite situation, when the meter carries a significant load (a load that varies much through time in the case of the voltage derivative) compared to the other meters, the voltage of this meter moves away from the instantaneous average voltage of the transformer. In the extreme case of a single meter that carries significant loads compared to the other meters, the multidimensional representation shown in FIG. 3 is replaced by that of FIG. 6A to which reference is now made and where the points associated to the voltages-series of the meters and the point associated to the voltage-series of the transformer are approximately collinear between them. In this limit case, the point corresponding to the meter that carries significant loads is the only one that is opposite to the other meters with respect to the point associated to the voltage-series of the transformer. In a multidimensional representation of the voltages-series, the point corresponding to the meter that carries significant loads moves closer to the origin (0,0, . . . ) while for a multidimensional representation of the voltages-series derivatives as illustrated in FIG. 6B, this point moves away from the origin. With respect to the point associated to the voltage of the transformer 22, the distance of the point 25 corresponding to the meter that carries significant loads increases with the relative value of the connection resistance of the meter and also with the number of meters that participate to the calculation of the voltage-series of the transformer. In this extreme case, the similarity based on the distance may give a false result for the meter that carries significant loads whereas the correlation appears to be preferable since there is a good collinearity between all the points for a low-voltage network with the corresponding voltage-series represented in the multidimensional space.

In practice, different extremes may well be observed for different meters at different times. An advantageous strategy resides in applying the best method at the moment deemed appropriate. In the following, it will be said that a meter is silent if it carries a small load or in the case of the voltage derivative, if it carries a small load variation. Likewise, it will be said that a meter is loud if it carries a high load or in the case of the voltage derivative, if it carries a high load variation compared to the other meters connected to the targeted transformer. To modulate the method between both extreme solutions, i.e. for a silent meter and for a loud meter, an improvement is brought to the similarity function based on the distance by correcting the voltage measured by the meter to take into account the voltage drop associated to the load flowing across the connection resistance of the meter, i.e. the resistance of the cable connecting the meter to the line. With this correction, the similarity by the distance gives good results for a meter that is between the silent state and the loud state. The corrected voltage-series for the meter i may be expressed as $$v_{i,n}^c = v_{i,n} + R_i \cdot c_{i,n} \tag{19}$$

with $$R_i = -\frac{\sum_{n=2}^N (\partial v_{i,n} - \partial v_{k,n}) \cdot \partial c_{i,n}}{\sum_{n=2}^N (\partial c_{i,n})^2} \tag{20}$$

a factor representative of the connection resistance. This factor is in Ohm units when the variable $c_{i,n}$ corresponds to the average current calculated for the time interval n. The quantity $c_{i,n}$ may also correspond to the consumption in kWh or to any other quantity representative of the load at the meter. FIG. 6B illustrates a vector representation of this correction 27 in the multidimensional space where $\partial C_i = \{\partial c_{i,0}, \ldots, \partial c_{i,n}, \ldots, \partial c_{i,N}\}$. In expression 20, the discrete derivatives $$\partial v_{i,n} = v_{i,n} - v_{i,n-1}, \quad (21)$$

$$\partial v_{k,n} = v_{k,n} - v_{k,n-1} \text{ and} \quad (22)$$

$$\partial c_{i,n} = c_{i,n} - c_{i,n-1} \quad (23)$$

are calculated for N records and consequently give N−1 derivative values. For equations 20 to 23, the voltage-series variables cannot be substituted by variables derived from voltage-series contrary to the other expressions.

Figure 7:
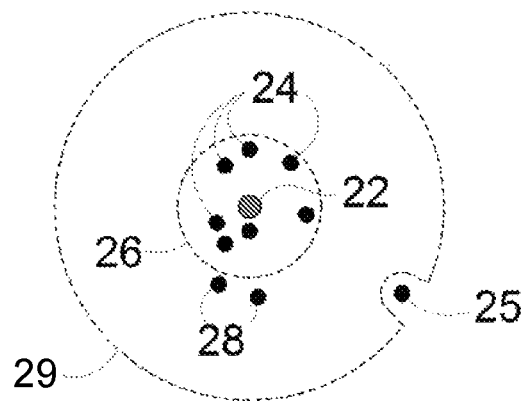
FIG. 7 shows a multidimensional representation of voltages of meters connected to a transformer, with the voltage-series of this transformer at the center and where a set of the meters said unchangeable is circumscribed by a hypersphere represented by the inner dotted circle, the whole set of meters presumed to be connected to the transformer being represented by the outer dotted circle that may include or not the representation of the voltage-series of a meter under validation.

Referring to FIG. 7, there is shown a multidimensional representation of voltages 24 of meters connected to a transformer, with the voltage-series 22 of this transformer at the center and where a set of the unchangeable meters is circumscribed by a hypersphere represented by the inner dotted circle 26, the set of all the meters presumed to be connected to the transformer being represented by the outer dotted circle 29 that may include the representation of the voltage-series 25 of a meter under validation or not.

The voltage-series at the transformer 22 appearing in expression 22 (and 20 by extension) may also be calculated from expression 2 on different populations of meters, whether on the unchangeable meters such as $$v_{k,n} = v_{k,n}^U, \quad (24)$$

or on the totality of the meters $$v_{k,n} = \frac{1}{T_k} \cdot \sum_{j_k \in T_k} v_{j,n} \quad (25)$$

in which case the meter i 25 is included or not. For the calculation of the factor R representative of the connection resistance, a preferred embodiment of the calculation method of $v_{k,n}$ is that expressed by equation 25 with exclusion of the meter i.

The distance similarity function is expressed as $$s_{i,k}^{Uc} = \sqrt{\sum_{n=1}^{N}(v_{i,n}^c - v_{k,n}^U)^2}. \quad (26a)$$

The estimation of the connection resistance given in 20 is not limited to the correlation of the voltage-series measured by a meter: it has many uses, one of which among others is the detection of electrical non-compliances. Indeed, as an example, a shunt circuit of the meter increases the apparent connection resistance. A resistance threshold may then be fixed so that, beyond the threshold, it will mean that there is a strong possibility of electrical non-compliance.

According to a preferred embodiment of the method, using equation 25 with exclusion of the meter i, in the case where $c_{i,n}$ corresponds to a current, the connection resistance estimated by equation 20 is higher or equal to the real value of the connection resistance. If the meter is the one located the closest to the transformer then the statistical expectation $R_i$ for a large number of estimations is equal to the connection resistance. If the meter is the farthest one connected on the line, considering that several meters are evenly distributed on the length of this line, the estimation given by equation 20 overestimates the resistance of about a half-length of the line on which it is connected. The intended goal of equation 20 is not to have an unbiased value of the connection resistance but rather to bring the voltage-series of the meter as close as possible from the voltage-series of the transformer before the distance calculation.

Illustrated in the multidimensional space, the correction 27 proposed by expression 19 brings the point corresponding to the voltage-series of the meter under validation 25 closer to the point of the voltage-series at the transformer 22 and results in that the similarity by the distance provides good results even if the meter is a bit loud. However, this correction may amplify or introduce an error when the estimation of the connection resistance is wrong. The estimation of the connection resistance of a meter is inaccurate when this meter carries no significant load such that the information on the connection resistance is not present in the measurements for this meter: however, since there is no significant manipulation of load $c_{i,n}$ for this meter, the result of expression 19 is unaffected. The problem is different in presence of an electrical non-compliance or of an error of allocation to the appropriate transformer which alters the estimation of the connection resistance when the meter carries significant loads with respect to the other meters. If too high resistance values are sometimes observed, too small values and even negative values are frequently observed too. Two thresholds are thus preferably set, a threshold for the minimum acceptable value of the connection resistance and a threshold for the maximum value. In a preferred embodiment, the minimum threshold is set between zero and the minimal resistance expected at the secondary of a distribution transformer, i.e. between zero and typically less than 10 mΩ. The maximum threshold of resistance is set in correspondence with the length of the anticipated maximal connection and the gage of the cable. Among the situations that explain why the connection resistance is outside these thresholds, there is that where the meter is not connected to the target transformer, that where the consumption conveyed by the meter is too small to obtain a valid estimation of the connection resistance and that where there is an electrical non-compliance.

In the preferred embodiment, the value of the connection resistance is limited by the minimum and maximum thresholds set in the calculation of the correction 27 (equation 19). Considering that the calculation of the connection resistance may be wrong and/or that the loads carried do not correspond to reality, the distance calculation retains the minimum distance value such as $$s_{i,k}^{Uc} = \min\left\{\sqrt{\sum_{n=1}^{N}(v_{i,n} - v_{k,n}^U)^2}, \sqrt{\sum_{n=1}^{N}(v_{i,n}^c - v_{k,n}^U)^2}\right\}, \quad (26b)$$

i.e. the minimum distance value with or without correction of the voltage drop with the load.

If a meter is loud on occasion and that its connection resistance value is outside the set thresholds while the voltage of this meter is close to the voltage-series of the transformer ($v_{k,n}$ or $v_{k,n}^U$) for several records, it means that this meter is most probably connected to the transformer and carries hidden loads or a hidden load proportion most of the time: the correspondences of voltages are observed at the moments where there is no manipulation of loads. If a meter is always silent, it is normal that the estimation of its connection resistance value is incorrect but, in return, the similitude by the distance is accurate and should locate it close to the voltage-series of a transformer: it should be an unchangeable meter. In a preferred embodiment, if a changeable meter has its connection resistance value outside the set thresholds for the calculation performed with the transformer to which it finally connects, this meter is qualified as a potential electrical non-compliance and its identifier is added to a list of potential electrical non-compliances 117 (as shown in FIGS. 5 and 9). If it is displaced more than once in the process, it is possible that it will be added more than once to the list and that at the end, with the last transformer to which it is assigned, its resistance value is in the valid range: it is useful to keep the successive displacements of such meters for a later check.

At the end of the process of the respective allocations of meters to transformers, a classification and an analysis of the similarity indexes allow identifying similarity outliers if there are any. The analysis may for example consist in simply using a threshold value. In the case of the correlation, a minimum threshold may for this purpose be set at 20%. If the meter under validation cannot be reallocated elsewhere on the line with a better percentage, this may indicate for example that it is not on the line (it is then possible to check if it should be allocated to another transformation station). There are also the correlations of negative values that will be considered as null and that are most often explained by statistical artefacts between the voltage-series of a meter and the voltage-series of a transformer to which it is not connected. In the case of the distance, the threshold value may be set to 3 standard deviations with respect to the average. For a similarity value comprised between 0 and 1, where 1 corresponds to the similarity maximum, a remapping may be achieved for the values close to 1 to tend towards a Gaussian distribution. The outliers may be joined to the list of potential ENCs 117. It is possible that a non-communicating meter be located close to the meter under validation, or that the meter be connected to another line or to a transformer not in the initial topological database thus explaining the outliers so obtained.

Two means of qualification of the pairing of a meter to a transformer are thus available, the first one, the correlation, is unit-less and the second one, the distance, is expressed in volts. The first means may advantageously be maximized while the second may advantageously be minimized. It is a matter of properly combining both expressions in order to pass from one to the other with some continuity. A remapping of the distance is proposed so that it is in the same domain as the correlation, i.e. [0.0, 1.0] and where the similarity maximum has a value of one. This remapping seeks to preserve the sensitivity that the distance has with the difference of length of the compared vectors, which the correlation has not since it is a collinearity indicator between the vectors regardless of their length differences. The link between both expressions may be expressed with respect to $V_a$ and $V_b$ that are two vectors each corresponding in the present context to a series of measured voltages. The square of the multidimensional distance $$\|V_a - V_b\|^2 = \|V_a\|^2 + \|V_b\|^2 - 2 \cdot (V_a \cdot V_b), \text{ where } \| \ldots \| \text{ is the norm operator,} \quad (27)$$

is function of the correlation since $$V_a \cdot V_b = \|V_a\| \cdot \|V_b\| \cdot \cos(\theta), \quad (28)$$

with the angle θ being the angle between both vectors in the multidimensional space, and that the cosine of this angle is the correlation coefficient such as $\gamma = \cos(\theta)$. Since $d_{a,b} = \|V_a - V_b\|$, this gives the relation $$\gamma_{a,b} = \frac{\|V_a\|^2 + \|V_b\|^2 - d_{a,b}^2}{2 \cdot \|V_a\| \cdot \|V_b\|} = \frac{\|V_a\|^2 + \|V_b\|^2}{2 \cdot \|V_a\| \cdot \|V_b\|} - \frac{d_{a,b}^2}{2 \cdot \|V_a\| \cdot \|V_b\|}. \quad (29)$$

In this expression of the correlation, the term on the left compensates for the distance that comes from the difference between the lengths of the vectors. Indeed, there is obtained $$\frac{\|V_a\|^2 + \|V_b\|^2}{2 \cdot \|V_a\| \cdot \|V_b\|} \geq 1$$

with the equality to one when the vectors have the same length. If this term on the left is replaced by one, there is no longer compensation as desired for the remapping of the distance towards the correlation. Then $$\gamma_{a,b}^d \equiv 1 - \frac{d_{a,b}^2}{2 \cdot \|V_a\| \cdot \|V_b\|} \quad (30)$$

is the distance to correlation remapping function.

Figure 6A:
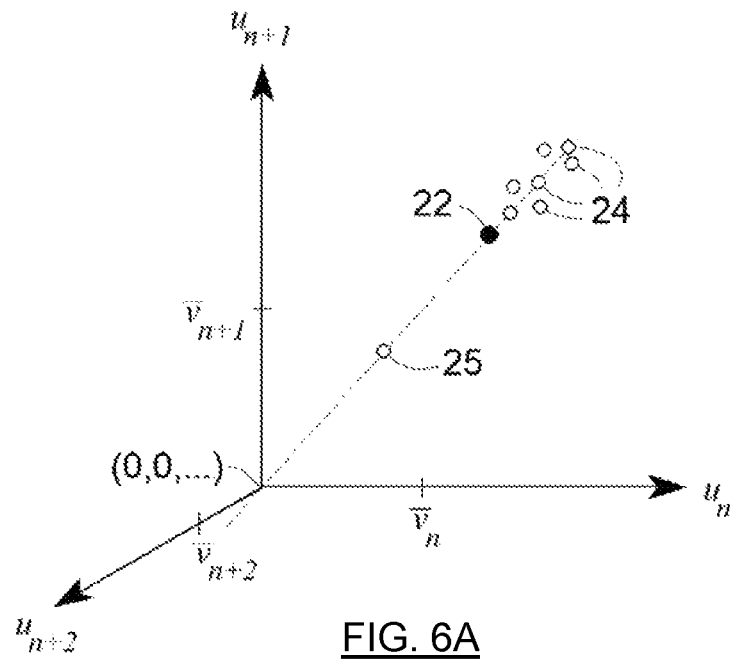
FIG. 6A shows a multidimensional representation of voltages-series of meters connected to a transformer, with the voltages-series of this transformer and where the voltages-series of a meter varies much more than that of the other meters due to a significant load carried by this meter.
Figure 6B:
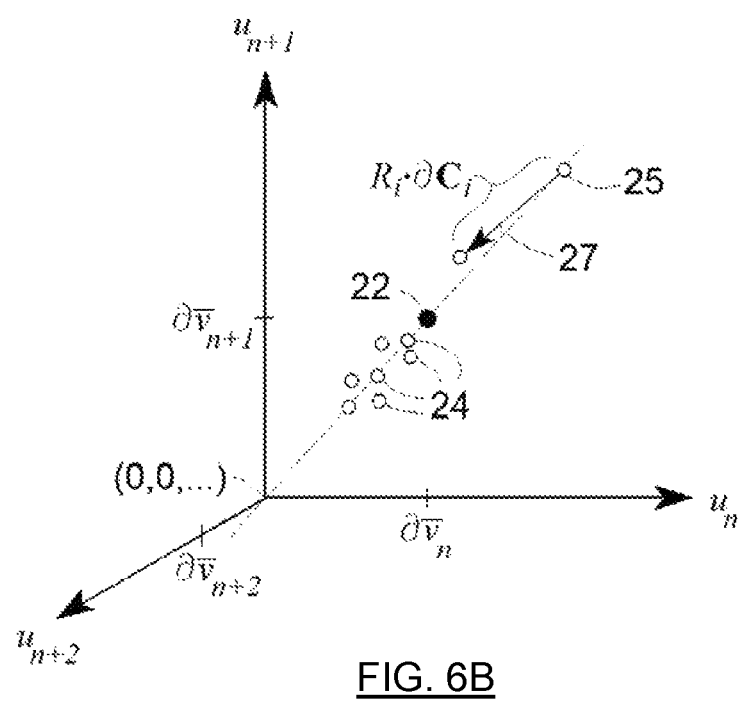
FIG. 6B shows a multidimensional representation for discrete derivatives of voltages-series with an example of correction of the voltage-series of a meter said loud.

With the increase of the load manipulation amplitude, the situation shown in FIG. 7 passes to that shown in FIGS. 6A and 6B. The correction of the voltage-series at the meter proposed in 19 and inserted in the calculation of the distance $s_{i,k}^{Uc}$ allows harmonizing the conversion from the distance to the correlation, the distance being calculated when the meter is not loud and the correlation being calculated when the meter is louder. The following $$\gamma_{i,k}^{Ud} \equiv 1 - \frac{(s_{i,k}^{Uc})^2}{2 \cdot \|V_i\| \cdot \|V_k\|} \text{ with } s_{i,k}^{Uc} = \quad (31a)$$

$$\min\left\{\sqrt{\sum_{n=1}^{N}(v_{i,n} - v_{k,n}^U)^2}, \sqrt{\sum_{n=1}^{N}(v_{i,n}^c - v_{k,n}^U)^2}\right\}$$

$$\|V_i\| = \sqrt{\sum_{n=1}^{N} v_{i,n}^2} \text{ and } \|V_k\| = \sqrt{\sum_{n=1}^{N} (v_{k,n}^U)^2} \quad (31b)$$

may define the equivalent of a correlation coefficient calculated from the distance between the voltage-series of a meter and that of a transformer.

Figure 9A:
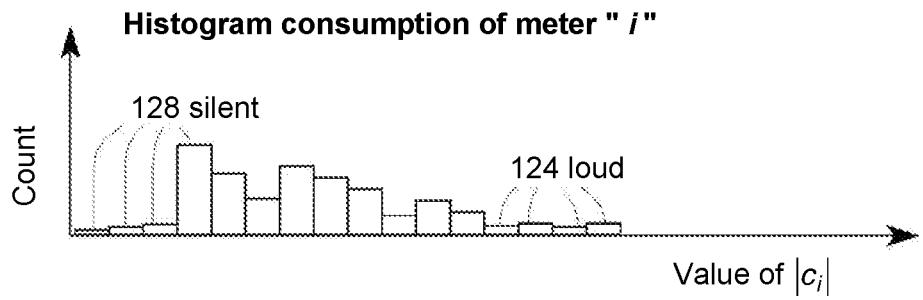
FIGS. 9A, 9B and 9C respectively show examples of a consumption histogram of a meter, a total consumption histogram comprising the sum of the consumptions of all the meters connected to a transformer, and a relative consumption histogram of a meter with respect to the total consumption where the intersection of the sets of statistical coincidences such as "loud meter"∩"silent network" on the right and "silent meter"∩"loud network" on the left is drawn in black.
Figure 9B:
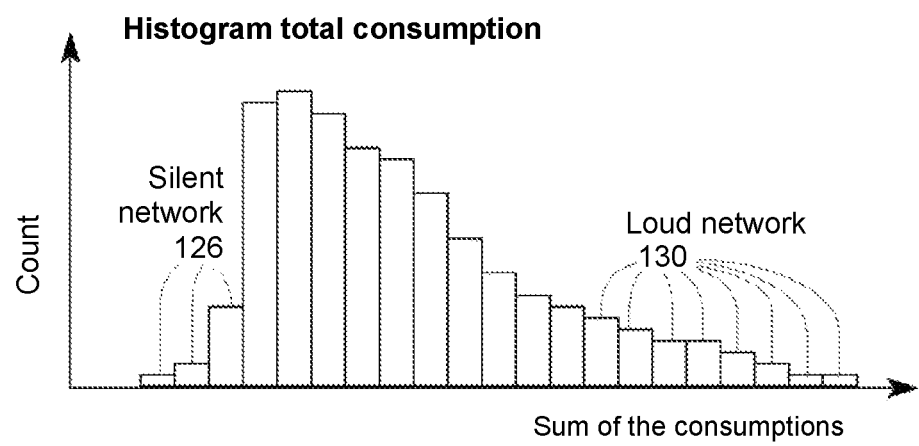
Figure 9C:
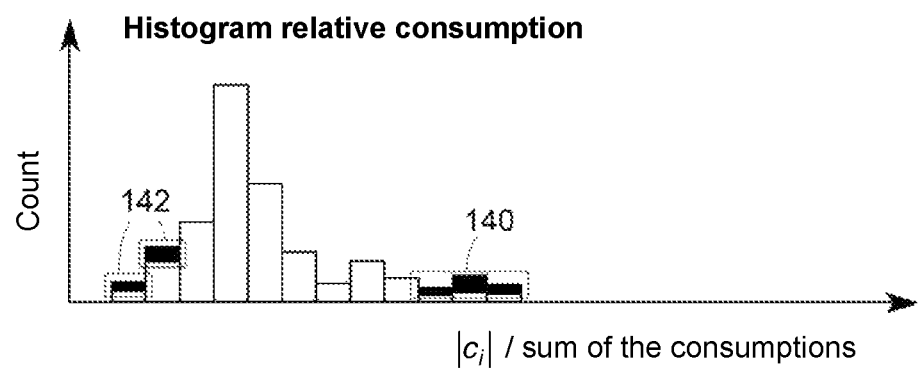

Both indicators may be merged as follows. Referring to FIGS. 9A, 9B and 9C, based on the hypothesis that the different meters do not manipulate their loads in synchronicity, there are moments for a meter where it is silent while the others are loud and conversely, moments where it is loud while the others are silent. The exceptions to this hypothesis are found, among other things, in the telephone and cable-distribution services where the meters are essentially silent since they carry small loads. Apart from these exceptions, the histograms illustrating the consumption for a meter (in terms of consumption, of current or of discrete derivatives thereof) as well as the probability of the sum of these consumptions for a transformer show that there are opportunities where one or the other, the meter or the network, is silent while the other is loud.

For example, a meter may be loud 124 or silent 128. Likewise, the sum of the consumptions of the meters may be loud 130 or silent 126. Among the occasions where a meter may be loud 124, it may be loud at some of these occasions 140 while the sum of the set of the meters appears to be silent 126, thus for a high proportion of consumption between that of the meter and the sum of the meters. Conversely, among the occasions where a meter may be silent 128, it may be silent at some of these occasions 142 while the sum of the set of the meters appears to be loud 130, thus for a small ratio of consumption between that of the meter and the sum of the meters. It is a matter of using these statistical opportunities to apply the correlation based similarity in the first case and the distance based similarity in the second case. It may be understood that these opportunities quickly decrease with the reading time interval of the meters (15 minutes, 60 minutes).

The generalized similarity function between the voltage-series of the meter i and a transformer k may be expressed as $$s_{i,k}^g = S^g(s_{i,k}^{Uc}, \gamma_{i,k}^U, c_{i,n}, c_{k,n}) \text{ with } c_{k,n} = \sum_{j \in T_k} c_{j,n} \quad (32)$$

which is function 1) of the distance between two voltage-series expressed in a multidimensional space, 2) of the correlation between these series and 3) of the time-series of consumption of the meter $c_{i,n}$, and of the time-series of consumption $c_{k,n}$ of the meters connected to the transformer k. The highest similarity value determines to which transformer the meter is connected. In this preferred embodiment, the correlations and the distances are carried out between the meter under validation and the voltage-series of the transformer calculated from the voltages-series of the unchangeable meters.

In an embodiment, the generalized similarity function $$s_{i,k,M}^g = ((1-P_{i,M}) \cdot \gamma_{i,k}^{Ud})^e (P_{i,M} \gamma_{i,k}^U)^e, \quad (33)$$

with the distribution (or switching) function $$P_{i,M} = G\left(\frac{\sum_{n \in M} \delta c_{i,n}^2}{\sum_i \sum_{n \in M} (\delta c_{j,n})^2}\right), 0 \le P_{i,M} \le 1.0, \quad (34)$$

is calculated for M non-necessarily time contiguous records such that n∈M, namely that the time index n of a record is an element of the set M of the indexes considered for this calculation. The exponent "c" is preferably set close to one. The distribution function may, for example, be a square root, a $T_k$-th root or a polynomial function limited between zero and one.

This expression (eq. 34) has the drawback of mixing the circumstances where the meter to be validated is silent with other moments where it is loud. Ideally, it is preferable to separate these moments and to cumulate each ones with the appropriate similarity function. In a preferred embodiment, the generalized similarity function $$s_{i,k}^g = \frac{N^S \cdot \gamma_{i,k}^{Ud} + N^B \cdot \gamma_{i,k}^U}{N^S + N^B} \quad (35)$$

where, from equation 17, $$\gamma_{i,k}^U = \frac{\sum_{n \in N^S} (v_{i,n} - \bar{v}_i) \cdot (v_{k,n}^U - \bar{v}_k^U)}{\sqrt{\sum_{n \in N^S} (v_{i,n} - \bar{v}_i)^2 \cdot \sum_{n \in N^S} (v_{k,n}^U - \bar{v}_k^U)^2}} \text{ and} \quad (36)$$

$$\gamma_{i,k}^{Ud} = 1 - \frac{\sum_{n \in N^B} (v_{i,n} + R_i \cdot c_{i,n} - v_{k,n}^U)^2}{2 \cdot \sqrt{\sum_{n \in N^B} (v_{i,n} + R_i \cdot c_{i,n})^2 \cdot \sum_{n \in N^B} (v_{k,n}^U)^2}} \quad (37)$$

with $N^S$ the set of records where the meter is silent and $N^B$ the set of records where the meter is loud, and this, such that $$N^S = \sum_{n \in N^S} 1 \text{ and } N^B = \sum_{n \in N^B} 1.$$

The distribution function $$P_{i,n} = \frac{|\delta c_{i,n}|}{\sqrt{\sum_j (\delta c_{j,n})^2}}, \quad (38)$$

characteristic of the relative consumption between the consumption of the meter and that of all the meters, allows choosing the records between the loud ones and the silent ones such as i∈$N^S$ if $P_{i,n}$<Threshold_silent (39a)

and i∈$N^B$ if $P_{i,n}$≥Threshold_loud (39b)

with Threshold_loud≥Threshold_silent. The thresholds may be set before execution of the method, may be function of the number of meters or dynamically or even iteratively adjusted in order to obtain a judicious distribution. In a preferred embodiment, the initial value is the same for both thresholds and is of 20%. The generalized similarity function has its value comprised between zero and one. This function has a maximum value when the meter is allocated to the proper transformer.

The case of city lightings is an example for which the generalized similarity function given at equation 35 provides much better results than that given at equation 33. Indeed, a city lighting always approximately has the same consumption and switches twice a day. Either on or off, the city lighting is perfectly silent regarding the derivative of the voltage-series. It is loud only when it switches. Combining the distance based similarity for periods where it is silent and the correlation based similarity when it switches gives the best result.

Referring again to FIG. 5, optimally, a single meter among all the transformers that could be allocated to another transformer 108 is preferably chosen and if a meter is displaced, the database is corrected and the process returns to the similarity calculation step 104 where the similarities are recalculated for both transformers affected by the displacement of the meter.

Figure 8:
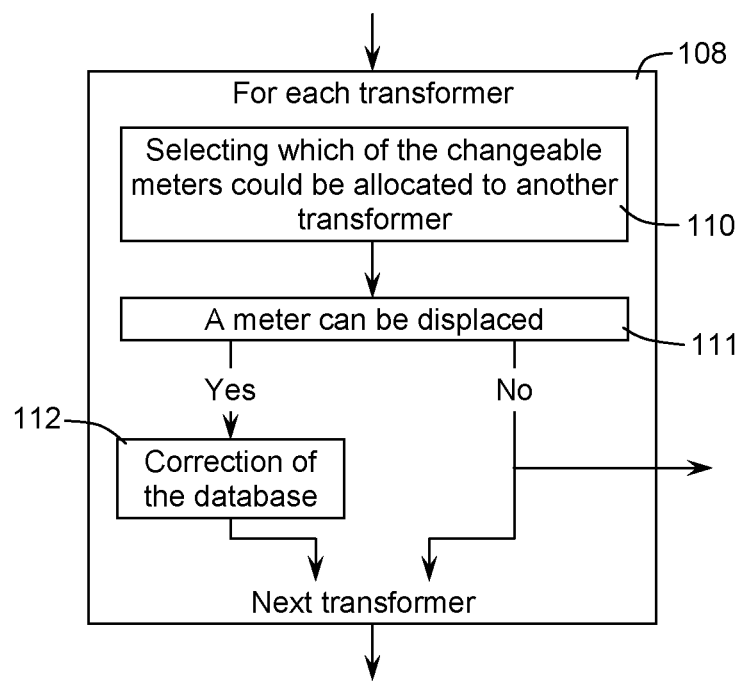
FIG. 8 is a diagram showing an embodiment of step 108 of FIG. 5 that minimizes a calculation time.

Referring to FIG. 8, another less calculation time consuming way to achieve step 108 may be of, for each transformer, choosing which one of the mobile meters could be allocated to another transformer as depicted by block 110, correcting the database as depicted by block 112 if the meter is displaced as depicted by block 111 and moving to the next transformer until all the transformers are processed. If at least one meter is displaced, the process returns to the similarity calculation step where, at the minimum, the terms for the transformers affected by the reallocations are recalculated. Whatever way 108 is used, the process ends when no meter is displaced as checked at step 113 (shown in FIG. 5).

At step 108, a meter may be displaced if its similarity increases with the displacement. When more than one meter may be displaced, a choice is preferably made for the most relevant meter to be displaced, which is performed at step 110. For each meter that can be displaced, the process has the similarity value that the meter has with the transformer k to which it is connected and the similarity value that the meter has with the transformer l targeted by this displacement. The combined function of the similarities to be optimized (minimized or maximized depending on the case) in the choice of the meter to be displaced may then be expressed as $$f(s_{i,k}{}^g, s_{i,l}{}^g) \qquad (40)$$

where k and l are respectively the index of the initial transformer and the index of the transformer targeted by the displacement. A person skilled in the art may consider several possible functions. A preferred embodiment of the method is expressed as $$f(s_{i,k}{}^g, s_{i,l}{}^g) = s_{i,l}{}^g - s_{i,k}{}^g \qquad (41)$$

so that among the changeable meters, it will be the one that gives a maximum to the combined function of similarity that will be selected as meter to be displaced.

Figure 10:
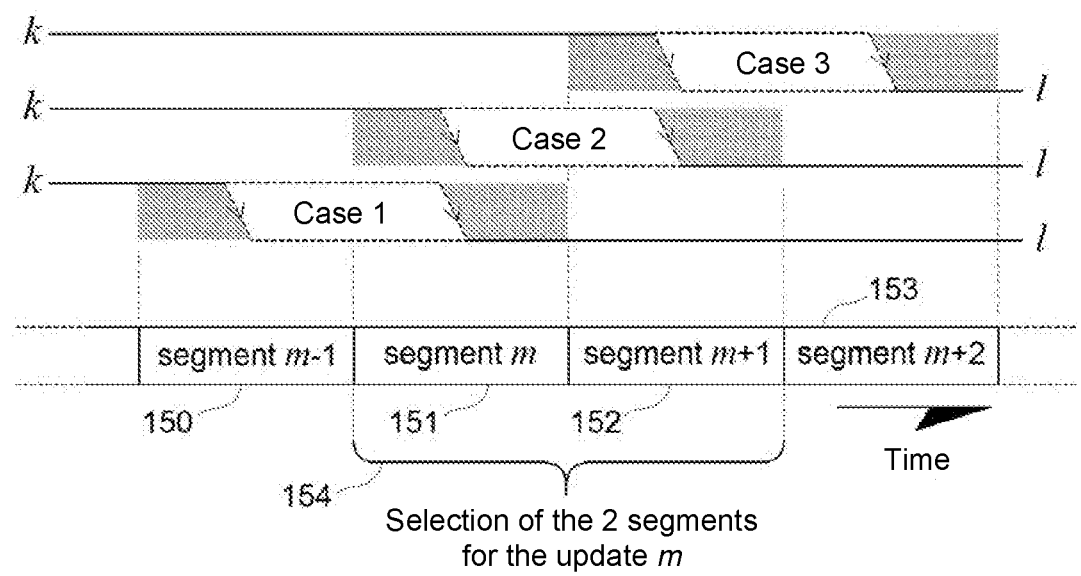
FIG. 10 is a schematic diagram showing a selection of segments by a differential method for determining and locating a meter displacement from a transformer k towards a transformer l where the superimposition of the three possible time ranges of occurrence of such a displacement is presented.

Referring to FIG. 10, the case of a time selection of data 154 where a meter displacement occurs may be specifically processed to determine the moment of displacement of the meter. The impact of such displacement is a similarity value between the values obtained for each transformer if the meter would have been connected to one or the other of theses transformers. In $R^N$, it is as if a line between the start position of the voltage-series before displacement of the meter and the end position after displacement would be drawn. The point corresponding to the time selection then moves close to this line from the start to the end according to a proportion of the voltage records contributing to the calculation and coming from before and after the displacement of the meter. According to a differential method as illustrated in FIG. 10, in a first step, the selection 154 comprises at least two successive time segments 151 and 152 followed by a calculation of meter to transformer allocation 110 (as illustrated in FIG. 9) performed for each segment, for example, by retaining the transformer, k or l, that maximizes equation 35. The selections may be successive and juxtaposed from one update to another, for example the selection m comprises the segments m 151 and m+1 152 and the selection m+1 comprises the segments m+1 152 and m+2 153. For an update m, there exist three possibilities for two calculated segments:

in a first case, the displacement of the meter occurs between the beginning of the second segment of the previous update (segment m−1) 150 and the end of the first segment of the current update (segment m) 151, then the segment m 151 and the segment m+1 152 respectively possibly and certainly indicate a displacement of the meter from k towards l, thus $s_{i,l} > s_{i,k}$ is necessarily validated for the segment m+1, in a second case, the displacement of the meter occurs between the beginning of the first segment of the current update (segment m) 151 and the end of the second segment of the current update (segment m+1) 152, then the segment m 151 and the segment m+1 152 both possibly indicate a displacement of the meter, in a third case, the displacement of the meter occurs between the beginning of the second segment of the current update (segment m+1) 152 and the end of the first segment of the next update (segment m+2) 153, then the segment m 151 and the segment m+1 152 respectively indicate no displacement of meter and possibly a displacement of the meter.

The overlap of these possibilities may be noted. In reality, the overlaps are minimal and located at the middle of the segments as illustrated by the parallelepipeds in FIG. 10. Both first cases may be processed during the current update m while the third case will be processed by the next update m+1: it may be understood that the method will miss a meter displacement that occurs near the end of the last segment and that the most recent topology found will be that near the middle of the second segment. An alternative method is to consider the similarity difference between two successive segments ( . . . , m−1 and m, m and m+1, . . . ) performed with respect to the transformer to which it is connected in view of a trigger threshold in order to detect a similarity decrease that will be attributed to a probable displacement of the meter. This example may be taken up by adding additional segments.

The differential method detects a meter displacement and roughly locates it, close to a segment length. When a displacement of the meter of index i is detected between the transformer k towards the transformer l, the similarity calculation for the distinct portions may be reexecuted to increase the resolution of the time location of the displacement, i.e. before (n<x) and after (n≥x) the displacement of the meter, such as $$S_{i,k,l,x} = S_{i,(k_{n<x}, l_{n \ge x})}{}^g \qquad (42)$$

where x is a positive integer such as x∈{0, 1, 2, 3 . . . ,N} determining the calculation range for the time index n. This similarity calculation will be performed for different time positions x of displacement to determine the position that gives the best similarity. Typically, the process will chose a search interval of time-stamped records of the range 0-N corresponding to a day for the step value of positions.

Figure 12:
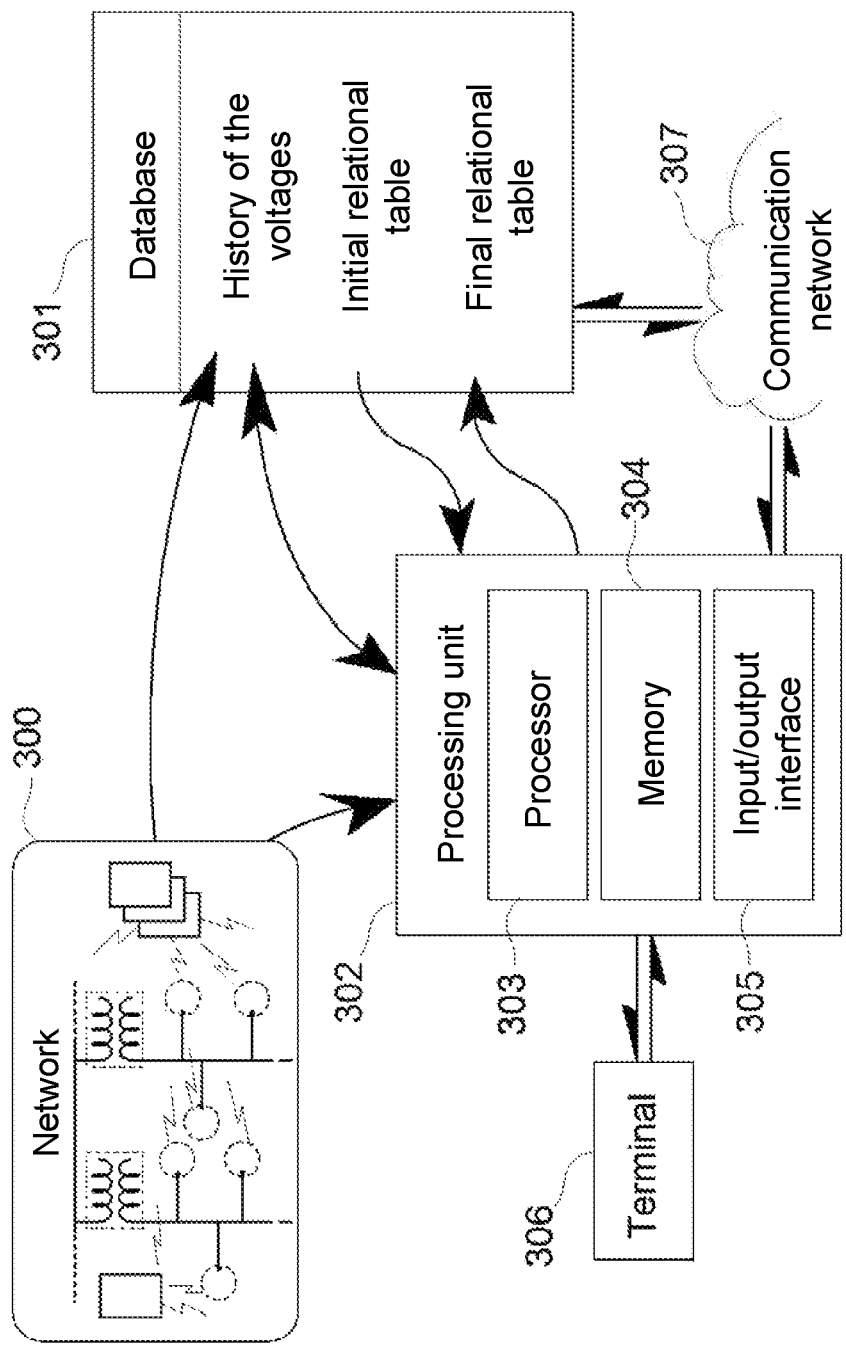
FIG. 12 is a schematic diagram showing a system executing the method according to an embodiment of the invention.

Once the displacement scheme of a meter between two transformers is found, the information {i, k, l, x} obtained from the optimization of 42 preferably forms part of the correlation performed at step 108 and is stored in the database 301 (as shown in FIG. 12).

Figure 11:
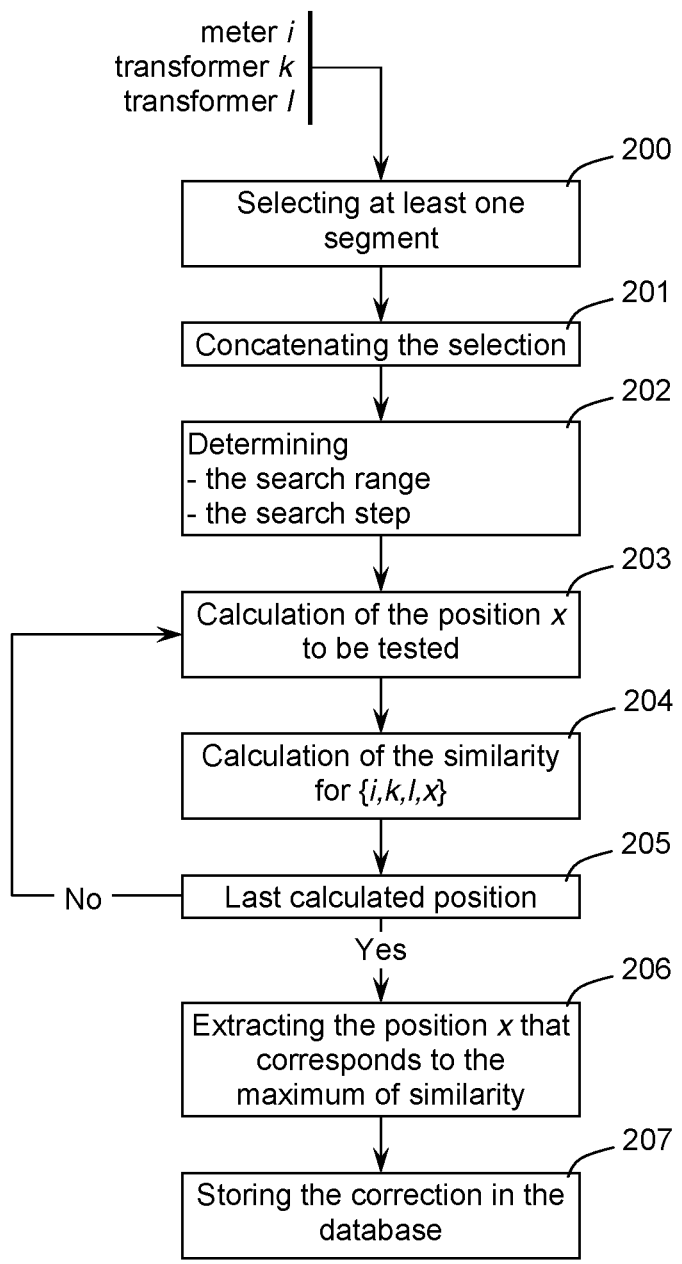
FIG. 11 is a schematic diagram showing steps of a method for estimating a time position that corresponds to the moment of a displacement of a meter between two transformers.

FIG. 11 shows steps of an estimation method of the time position corresponding to the moment of the displacement of a meter. At the beginning, the index i of the displaced meter and the indexes {k,l} of the initial and final transformers are known and possibly come from the method that refers to FIG. 10. The process may then have the following series of steps:

1. selecting at least one segment 200,
2. concatenating the selected segments to form a single continuous segment 201,
3. determining the search range where the positions x will be tested and the search step 202,
4. calculating the position x to be tested 203,
5. calculating the similarity for this position 204, 6. if the last position to be tested is processed, continuing with step 7 otherwise returning back to step 4 205,
7. extracting the position x that corresponds to the similarity maximum 206,
8. storing the correction determined from the result of step 7 for this displacement 207 in the database 301.

This method may advantageously be modified to reduce the computing power by modifying steps 3 to 7 so that they correspond to a binary search where the search range is reduced by half at each step. Other application methods of equation 42 may be used to estimate the position x corresponding to the moment of the displacement of the meter.

A preferred embodiment with respect to the different steps, and more particularly the equations 2 and 15 for the calculation of the voltage-series of a transformer and the calculation of the corrected voltage-series of a transformer, will take the position x into account in the allocation of the member i to the set $T_k$ in the expression $i \in T_k$ in order to consider the displacement of each meter through time to allocate the portion of the voltage-series (or derivative of the voltage-series) measured by a meter to the transformer connected for this time portion.

At the beginning of the application of the method, the topological description may correspond to an overview of it at a given time or yet a topological description where the information $\{k,l,x\}$ is historically known for each meter. However, the result given by the application of the method is preferably organized to be dynamic through time, so as to comprise a history of the displacements of meters and from this history to be able to extract a corresponding topology for a desired moment. A situation of the state of the topology, the data used and the progression of the execution of the method according to the invention at any moment chosen by the user or ongoing may be presented on a user interface in real-time or not in the form of graphics, data, pictures, graphs, diagrams, messages, etc.

The method according to the invention allows updating a topology exhibiting a minimal average proportion $\alpha$ of valid allocations. In the case where this minimal proportion is not reached and that there is no convergence towards a plausible solution or in the case where there is no information on the topology of the network in the database, there is proposed a method that imperfectly builds up a first topology that may thereafter be corrected by the correction method according to the invention. Assuming clouds made of the voltages-series of the meters 24 as shown in FIG. 3 where the meters are not allocated to a transformer, the process may clusterize these points in $R^N$ in order to regroup the points corresponding to a transformer for each cloud. An example of clustering means that is not optimal but more calculation time efficient than a usual k-means algorithm is proposed in US2014/0100821 (Leonard) entitled "Dynamic clustering of transient signals". If known, the number of transformers on the network sets the maximal number of clusters to process by this method. The application of this clustering method or any other similar method will produce distinct clusters each corresponding to a transformer. However, the cluster to transformer link remains to be done. In absence of information in the database that would allow linking at least one meter to a transformer for each cluster built by the method, it is then necessary to go out into the field to link each cluster to a transformer identifier (ID). Once the cluster to transformer links are made, this topology estimation is submitted to the above-described method in order to accurately update the topology. With respect to a meter connected to a single transformer according to the initial topology, it is de facto unchangeable. Also, if a meter is removed from a transformer so that only one meter remains, the last remaining meter is unchangeable. In the case of two meters connected to a transformer, this case is processed so that the transformer is cloned for the validations, i.e. one validation with a meter that is unchangeable and the second validation with the other meter that is unchangeable.

Table A shows results obtained for a line comprising 116 transformers with 1118 consumption sites. An exhaustive validation in the field has allowed confirming 24 allocation errors in the non-corrected topological database. For a resolution of 0.01V and 0.01 kWh with a reading every 15 minutes, the proposed method has detected 23 of the 24 allocation errors with only two false positives, which respectively corresponds to an accuracy rate of 92% and a recall of 96%, regarding the 24 allocation errors. It may be noticed that the accuracy of the method decreases with the time lengthening of the reading interval and may not be reliable for a resolution of 1V and 1 kWh.

TABLE A

Results obtained for a medium-voltage line comprising 1118 consumption sites as a function of the resolution of the measurement and the reading time interval

| | Measurement resolution | | | | | |
|---|---|---|---|---|---|---|
| | 0.01 V and 0.01 kWh | | | 1 V and 1 kWh | | |
| | Time interval | | | | | |
| | 15 min | 30 min | 60 min | 15 min | 30 min | 60 min |
| False positive | 2 (8%) | 2 (8%) | 3 (13%) | 32 (68%) | 94 (87%) | 211 (98%) |
| False negative | 1 (4%) | 3 (13%) | 4 (17%) | 9 (38%) | 10 (42%) | 19 (79%) |

Referring to FIG. 12, there is shown an example of computer system and a physical arrangement of connectivity with different apparatuses used by the method according to the invention. A processing unit 302, comprising at least one processor 303 and a memory 304, and provided with an input/output interface 305, receives the voltage data or records from the meters of the network 300 or from a database 301 that may contain the histories of measurements of voltages and relational tables or other data storage structures that describe the topology of the network. The database containing the voltage measurements of the meters may be distributed through the meters if they are equipped with storage devices or functionalities that may be queried as need be or, yet, through devices for storage of the measurements from the meters on a distribution network as such or, yet, on a central data storage device receiving the data provided by the meters or, yet, a combination of all of the above.

The processing unit 304 has in its memory 304 instructions executable by the processor 303 and configuring the processing unit 302 to perform the steps of the method according to the invention, as described hereinabove. The network 300 comprises the distribution and consumption electrical network, the smart meters and any communication equipment, servers and database connected to this network. The history of the voltages contained in the database 301 may have been generated and stored therein by the network 300 and/or the processing unit 302. The processing unit 302 may be configured by a terminal 306 connected thereto or by another equipment connected thereto by a communication network 307. According to an embodiment, the configuration comprises among other things the interval between two automatic executions of the update of the topology and the choice of the parameter a. When available in the database 301, the relational table describing the topology of the distribution network is transmitted to the processing unit 302, or else the processing unit applies a clustering method to find a first assessment of the topology. The processing unit 302 may start the application of the method by the selection of the segments 101 (as shown in FIG. 5) by querying the database 301 to obtain the history of the voltages and ends up the processing by transmitting the relational table of the updated topology to the database 301. The data update may also be performed during the progression of the method. The database 301, and more particularly the relational tables contained therein, may be read by other applications for example from the communication network 307.

While embodiments of the invention have been illustrated in the accompanying drawings and described above, it will be evident to those skilled in the art that modifications may be made therein without departing from the invention.

The invention claimed is:

1. A computer implemented method for automatic correction of a topology of an electrical distribution network defined by respective allocations of meters to transformers, the method comprising the steps of:
  (i) for each transformer of the topology, dividing up the meters allocated to the transformer into first and second batches according to a dividing criteria and a degree of similarity of the records of voltages measured by the meters with respect to an average voltage estimated with the records of voltages measured by the meters allocated to the transformer so that the first batch comprises the meters whose degree of similarity is higher than the meters of the second batch;
  (ii) initially for each transformer of the topology then subsequently for each transformer whose allocation of meters has changed, calculating a corrected average voltage with the records of voltages measured by the meters only in the first batch of the transformer;
  (iii) calculating a similarity of the records of voltages measured by the meters in the second batches of the transformers with the corrected average voltages of the transformers calculated in (ii);
  (iv) for each transformer of the topology, determining which are, in the second batch, the meters attributable to another transformer according to the similarities calculated in (iii);
  (v) reallocating at least one of the meters determined in (iv); and
  (vi) as long as a meter has been reallocated in (v), repeating steps (ii) to (v),
the topology being corrected when there remain no more meters attributable to other transformers in the second batches.

2. The method according to claim 1, further comprising the step, between steps (iv) and (v), of prioritizing at least one meter to be reallocated according to a decreasing order of the similarities calculated in (iii).

3. The method according to claim 1, wherein the similarity calculated in (iii) is determined as a function of:
  a multidimensional analysis of the records of voltages measured, the similarity being quantified according to distances between voltages of time-series of the records with respect to the average voltages of the transformers represented in a multidimensional space;
  a correlation analysis between the time-series of the records;
  or results of a function combining results of the multidimensional and correlation analyses.

4. The method according to claim 3, wherein the similarity calculated in (iii) is further determined as a function of a contribution of time-series of records of consumptions measured by the meters.

5. The method according to claim 3, wherein a switching of the records of voltages between the multidimensional analysis and the correlation analysis is carried out as a function of consumption levels determined from corresponding time-series of records of consumptions measured by the meters.

6. The method according to claim 3, wherein the function combining the results comprises a remapping of a distance towards a correlation according to the equation:

$$\gamma_{a,b}^d \equiv 1 - \frac{d_{a,b}^2}{2 \cdot \|V_a\| \cdot \|V_b\|}$$

where $V_a$ and $V_b$ are vectors corresponding to series of records of voltages measured by a meter under validation in the multidimensional space, $d_{a,b}$ is a distance between ends of the vectors in the multidimensional space, and $\| \ldots \|$ is a norm operator.

7. The method according to claim 3, wherein the similarity calculated in (iii) for a meter under validation further comprises:
  an estimation of a connection resistance of the meter under validation from the records of voltages measured by the meter under validation, an average voltage estimated with the records of voltages of all the meters connected to the transformer targeted by the calculation of similarity, and values representative of a load at the meter under validation according to records of consumptions measured by the meter under validation; and
  a correction of the voltage measured by the meter under validation as a function of the connection resistance estimated and the records of consumptions measured by the meter under validation.

8. The method according to claim 7, wherein the connection resistance of the meter under validation is estimated as a function of variations of amplitudes between the records.

9. The method according to claim 7, wherein a potential electrical non-compliance is detected when the connection resistance of the meter under validation has a value outside a predefined valid range.

10. The method according to claim 1, further comprising, before step (i), the step of selecting data segments defining time-stamped ranges of the records to which the calculations in steps (i) to (iii) are applied.

11. The method according to claim 10, further comprising the step of validating the data in the segments by detecting blackouts and anomalies in the data and by rejecting the corresponding time-stamped records.

12. The method according to claim 1, further comprising the steps of:
  communicating with a topological database of an electrical network to obtain data indicative of the topology of the electrical distribution network and updating the data as a function of the reallocations of the meters in (v); and
  communicating with a database storing measurements provided by the meters to obtain the records of voltages measured by the meters.

13. The method according to claim 12, wherein the updated data comprise a history of the reallocations of the meters to the transformers in order to keep track of an evolution of the topology and that a configuration of the topology at a given time be determinable.

14. The method according to claim 12, wherein the similarity calculated in (iii) further comprises:
a detection of a reallocation of a meter of index i of a transformer k towards a transformer l; and
an optimization of a time-stamped location of the reallocation by calculating a similarity for different time positions x of reallocation before and after the reallocation of the meter such as $$S_{i,k,l,x} = S_{i,(k_{n<x}, l_{n\geq x})}{}^g$$

where x is a positive integer such as $x \in \{0,1,2,3 \ldots, N\}$ determining a calculation range for the time index n, the position that gives the highest similarity being retained, the information $\{i,k,l,x\}$ resulting from the optimization being included in the updated data.

15. The method according to claim 1, wherein the dividing criteria is a ratio of meters to be distributed between the first and second batches or a maximum number of meters in the second batch.

16. The method according to claim 1, wherein the similarities calculated in (iii) are classified and analyzed with respect to preestablished conditions of detection of outliers indicative of potential electrical non-compliances.

17. A computer system for automatic correction of a topology of an electrical distribution network defined by respective allocations of meters to transformers, the computer system comprising at least one storage device for a database of topological data representing the topology of the electrical distribution network, at least one storage device for records of voltages measured by the meters, and a processing unit having an interface for communicating with the storage devices, at least one processor and a memory storing instructions executable by the processor and configuring the processing unit to perform the steps of:

(i) for each transformer of the topology, dividing up the meters allocated to the transformer into first and second batches according to a dividing criteria and a degree of similarity of the records of voltages measured by the meters with respect to an average voltage estimated with the records of voltages measured by the meters allocated to the transformer so that the first batch comprises the meters whose degree of similarity is higher than the meters of the second batch;

(ii) initially for each transformer of the topology then subsequently for each transformer whose allocation of meters has changed, calculating a corrected average voltage with the records of voltages measured by the meters only in the first batch of the transformer;

(iii) calculating a similarity of the records of voltages measured by the meters in the second batches of the transformers with the corrected average voltages of the transformers calculated in (ii);

(iv) for each transformer of the topology, determining which are, in the second batch, the meters attributable to another transformer according to the similarities calculated in (iii);

(v) reallocating at least one of the meters determined in (iv); and (vi) as long as a meter has been reallocated in (v), repeating steps (ii) to (v), the topology being corrected when there remain no more meters attributable to other transformers in the second batches.

* * * * *